US010198534B2

(12) United States Patent
Blanchard

(10) Patent No.: US 10,198,534 B2
(45) Date of Patent: Feb. 5, 2019

(54) ILLUSTRATING ELEVATIONS ASSOCIATED WITH A MINE WORKSITE

(71) Applicant: Caterpillar of Australia Pty. Ltd., Tullamarine (AU)

(72) Inventor: Glen Peter Blanchard, Upper Coomera (AU)

(73) Assignee: Caterpillar of Australia Pty. Ltd., Victoria (AU)

( * ) Notice: Subject to any disclaimer, the term of this patent is extended or adjusted under 35 U.S.C. 154(b) by 781 days.

(21) Appl. No.: 14/662,632

(22) Filed: Mar. 19, 2015

(65) Prior Publication Data

US 2015/0347637 A1    Dec. 3, 2015

(30) Foreign Application Priority Data

May 30, 2014  (AU) .................................. 2014202959

(51) Int. Cl.
G06F 17/50       (2006.01)
(52) U.S. Cl.
CPC ................................ G06F 17/5004 (2013.01)
(58) Field of Classification Search
CPC .................................................... G06F 17/5004
USPC .............................................................. 703/1
See application file for complete search history.

(56) References Cited

U.S. PATENT DOCUMENTS

| 6,047,227 A | 4/2000 | Henderson et al. | |
| 2006/0020431 A1* | 1/2006 | Gipps | G06Q 10/047 703/1 |
| 2006/0262117 A1* | 11/2006 | Chiba | G09B 29/12 345/440 |
| 2008/0212893 A1 | 9/2008 | Serbanescu | |
| 2010/0208981 A1* | 8/2010 | Minear | G06T 11/001 382/154 |
| 2011/0212717 A1* | 9/2011 | Rhoads | G06F 17/30241 455/420 |

* cited by examiner

Primary Examiner — Andre Pierre Louis
(74) Attorney, Agent, or Firm — Oblon, McClelland, Maier & Neustadt

(57) ABSTRACT

Disclosed herein is a method and computing system for illustrating elevations in an image corresponding to an area of interest that is at least a portion of a mine worksite. The method includes determining, by a selection, a first dataset that includes a plurality of elevation values defining an elevation topography for a first area of interest. The method further includes, for each of the at least a portion of the elevation values in the first dataset, determining a corresponding color for illustrating the elevation value according to a scale of colors. The scale spans a defined range of altitudes. Each color in the scale is definable by a hue; and at least one parameter for influencing at least one of a lightness and a darkness of the color. The color scale is defined to progress through a spectrum of hues across the defined range of altitudes. The method also includes generating a first image portraying at least a 3-dimensional, non-plan view of the elevation topography for the first area of interest, illustrating the at least a portion of the elevation values of the first dataset in the corresponding determined colors.

18 Claims, 11 Drawing Sheets

(11 of 11 Drawing Sheet(s) Filed in Color)

ILLUSTRATING ELEVATIONS ASSOCIATED WITH A MINE WORKSITE

FIELD OF THE INVENTION

The present disclosure relates to methods and systems for Illustrating elevations associated with a mine worksite.

BACKGROUND OF THE INVENTION

In the mining industry, mine operators need to prepare infrastructure for vehicle and equipment access, and for transporting ore and other materials. Such infrastructure includes roads, drill holes, and other features created by manipulating of the topography of the worksite. The creation of such infrastructure involves designing an intended topography for the worksite and manipulating the worksite, by cutting away parts of the worksite that are above an intended elevation (above grade) and by filling areas of the worksite below an intended elevation (below grade) in order to meet the specification tolerances of the design. However, it can be difficult to assess the status of work that has been done or that needs to be done in fulfilling this objective, because elevations associated with the worksite may be difficult to monitor or comprehend. Accordingly, there is a need for a new method and/or system for illustrating altitudes associated with a mine worksite.

Reference to any prior art in the specification is not an acknowledgment or suggestion that this prior art forms part of the common general knowledge in any jurisdiction or that this prior art could reasonably be expected to be understood, regarded as relevant, and/or combined with other pieces of prior art by a skilled person in the art.

SUMMARY OF THE INVENTION

In one aspect of the present disclosure there is provided a method of illustrating elevations in an image corresponding to an area of interest that is at least a portion of a mine worksite. The method includes determining, by a selection, a first dataset that includes a plurality of elevation values defining an elevation topography for a first area of interest. The method further includes, for each of the at least a portion of the elevation values in the first dataset, determining a corresponding colour for illustrating the elevation value according to a scale of colours. The scale spans a defined range of altitudes. Each colour in the scale is definable by a hue; and at least one parameter for influencing at least one of a lightness and a darkness of the colour. The colour scale is defined to progress through a spectrum of hues across the defined range of altitudes. The method also includes generating a first image portraying at least a 3-dimensional, non-plan view of the elevation topography for the first area of interest, illustrating the at least a portion of the elevation values of the first dataset in the corresponding determined colours.

In another aspect of disclosure, there is provided a computing system for illustrating elevations in an image corresponding to an area of interest that is at least a portion of a mine worksite. The computing system comprises: a display device; a memory system for storing computer executable instructions; and a processing system. The processing system is configured to read the computer executable instructions from the memory system. Upon executing the computer executable instructions, the processing system is configured to determine, by a selection, a first dataset that includes a plurality of elevation values defining an elevation topography for a first area of interest. The processing system is further configured to, for each of the at least a portion of the elevation values in the first dataset, determine a corresponding colour for illustrating the elevation value according to a scale of colours. The scale spans a defined range of altitudes. Each colour in the scale is definable by a hue; and at least one parameter for influencing at least one of a lightness and a darkness of the colour. The colour scale is defined to progress through a spectrum of hues across the defined range of altitudes. The at least one parameter changes to lighten and darken the colour in a cyclical manner across the defined range of altitudes. The processing system is also configured to generate, on the display device, a first image portraying at least a 3-dimensional, non-plan view of the elevation topography for the first area of interest, illustrates the at least a portion of the elevation values of the first dataset in the corresponding determined colours.

In a further aspect of the present disclosure there is provided another method of illustrating elevations in an image corresponding to an area of interest that is at least a portion of a mine worksite. The method includes determining a dataset that includes a plurality of elevation values defining an elevation topography for the area of interest. The method further includes, for each of the at least a portion of the elevation values in the dataset, determining a corresponding colour for illustrating the elevation value according to a scale of colours. The scale spans a defined range of altitudes. Each colour in the scale is definable by a hue; and at least one parameter for influencing at least one of a lightness and a darkness of the colour. The colour scale is defined to progress through a spectrum of hues across the defined range of altitudes. The at least one parameter changes to lighten and darken the colour in a cyclical manner across the defined range of altitudes. The method also includes generating an image portraying at least a 3-dimensional, non-plan view of the elevation topography for the area of interest, illustrating the at least a portion of the elevation values of the dataset in the corresponding determined colours. The determined dataset includes elevation values corresponding to recorded data and reference data. The recorded data represents an elevation map of a surface of the mine worksite for the area of interest, the elevation map being based on measured data for the surface. The reference data represents a reference elevation topography for the area of interest. The method further includes generating model data, based on the determined dataset. The model data defines a 3-dimensional model for illustrating, in the image, a 3-dimensional view of the model, portraying divergence between the elevation map and the reference elevation topography by illustrating the elevation map overlayed onto the reference elevation topography. The elevation map and reference elevation topography are displayed with different respective surface textures.

Embodiments of the present disclosure may include any combination of features described herein. For example, the features listed amongst the dependent claims may be combined in any manner, and incorporated into the independent claims.

As used herein, except where the context requires otherwise, the term "comprise" and variations of the term, such as "comprising", "comprises" and "comprised", are not intended to exclude further additives, components, integers or steps.

Further aspects of the present invention and further embodiments of the aspects described in the preceding paragraphs will become apparent from the following description, given by way of example and with reference to the accompanying drawings.

BRIEF DESCRIPTION OF THE DRAWINGS

The patent or application file contains at least one drawing executed in colour. Copies of this patent or patent application publication with colour drawing(s) will be provided by the Office upon request and payment of the necessary fee.

DETAILED DESCRIPTION OF THE EMBODIMENTS

Figure 1:
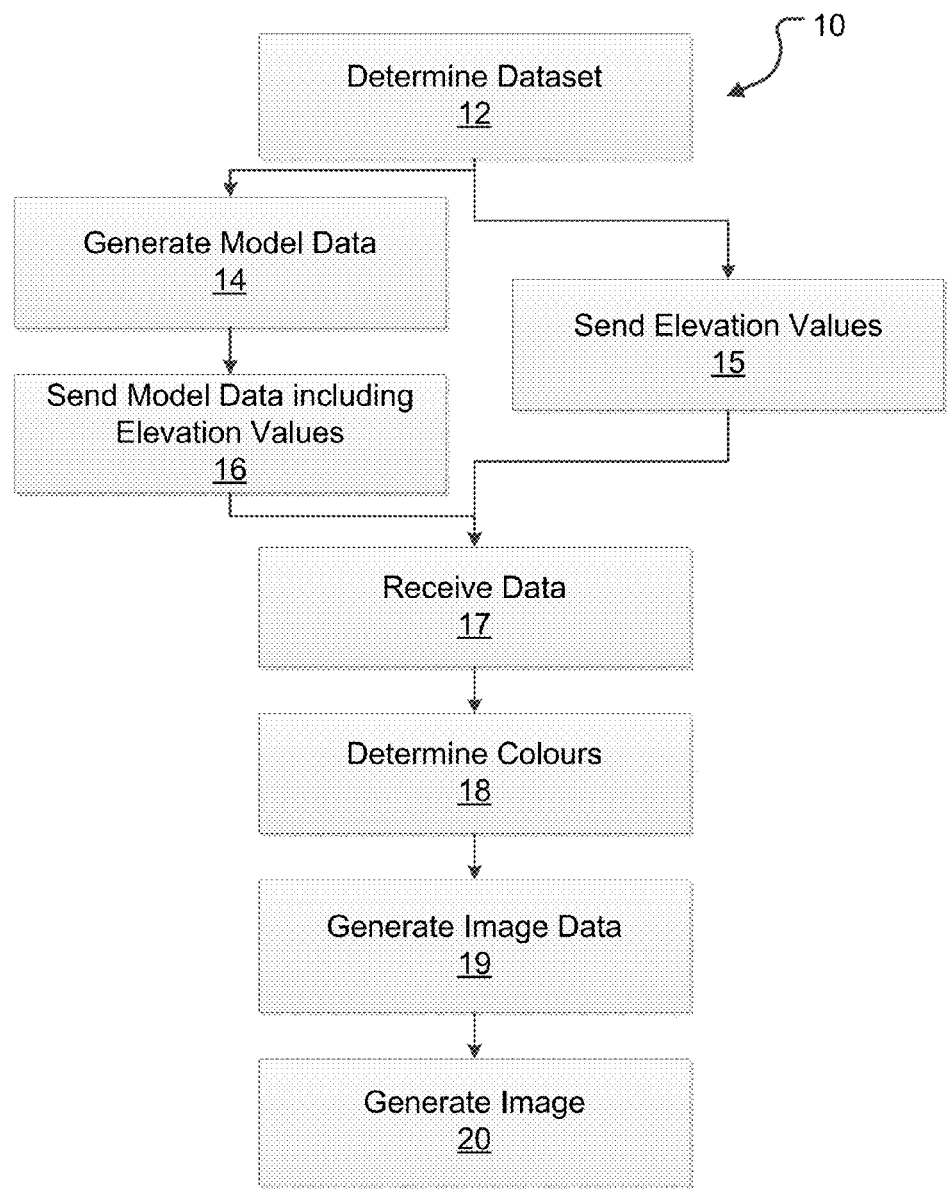
FIG. 1 is a flow chart of a computer-implemented method for illustrating elevations and/or work status for an area of interest in a mine worksite, in accordance with the present disclosure.

An exemplary process 10 for performing a computer-implemented method for illustrating elevations and work status for an area of interest in a mine worksite is illustrated in FIG. 1. Process 10 derives a 3-dimensional (3D) model for comparing differences between the input two elevation models for the area of interest.

A first of the elevation models is an elevation map of a surface of the mine worksite. The elevation map is comprised of recorded data that is based on measurements taken for the surface. Therefore the elevation map represents an actual elevation topography possessed by the worksite. The recorded data includes elevation values, each of which define an altitude for a corresponding position in grid of position coordinates. The position coordinates may, for example, represent longitude and latitude coordinates, or east/west and north/south distances from a reference location. The altitudes defined by the elevation values may be defined with respect to an absolute reference altitude, such as mean sea level. In other embodiments, the altitudes are defined with respect to a mine specific location. The elevation map is thus represented as a digital elevation model for an area of the mine worksite that includes at least the area of interest associated with a work task.

The second elevation model is a reference elevation topography for at least the area of interest to which the first elevation map is compared. In one embodiment, the reference elevation topography is a designed elevation topography that is intended for the area of interest. Such a designed elevation topography is generated by computer-aided design (CAD) software. In an alternative embodiment, however, the reference elevation topography may be a second elevation map for at least the area of interest. The second elevation map may be based on measurements of the area's topography taken at some time different to that of the first elevation map.

At a first step 12 in process 10, a dataset is determined to comprise the two input elevation models. For simplicity the two elevation models are hereinafter exemplified as a first elevation map based on measurements, and a reference elevation topography defined by design data, as discussed above. For reference elevation topography may, for example, represent an intended topography model for road for a dragline.

The elevation map is generally recorded in a raster format which defines a rectangular grid of matrix values, the grid location corresponding to a 2-dimensional location coordinate (eg. meters north and east compared with a reference location). The value stored at each grid location defines the elevation at the coordinate. The elevation value may be directly measured data or may be interpolated or transformed from other measured elevation data. The recorded elevation map may have an accuracy of 10 mm. The data for the elevation map may be collected by one or more vehicles that move along the surface of the worksite, logging their location coordinates and elevation derived from a positioning system on the vehicles.

The reference elevation topography is generally stored as a CAD file which defines a designed elevation topography using vectors. Such a vector-based representation may be a triangulated irregular network (TIN).

Once the dataset has been determined, model data defining a 3-dimensional model including at least a representation of the difference in elevation between the two input models is generated at step 14. The generated model is derived, at least in part, by subtracting the elevation of one of input models from the other. To prepare the data for subtraction, the reference elevation topography is converted to a set of elevation values, in raster format, to enable a matrix subtraction. In the subtraction process, each coordinate value in one matrix is subtracted from the value of the corresponding coordinate in the other matrix. For example, elevation values for the reference elevation topography may be subtracted from elevation values for the recorded elevation map that correspond to the same coordinates.

The result of the subtraction is 3-dimensions of spatial data, represented as raster matrix, and which may define a 3-model to be illustrated, or may define part of the illustrated model. This calculated raster matrix defines a 2 dimensional matrix or grid of coordinates covering the area of interest, with each coordinate having an associated third dimension value representing a vertical or elevation divergence between the two input models. Since the reference elevation topography was subtracted from the elevation map, positive values of the outputted raster matrix indicate that the surface of the mine has a higher altitude than the reference elevation topography, whereas negative values indicate that the surface of the mine has a lower altitude than the reference elevation topography. In one embodiment the outputted raster includes elevation data accurate to 10 mm, provided for location coordinate measurements that are spaced in 1 meter increments. The outputted raster is also referred to herein as a "difference raster" or "difference file".

As has been discussed, a 3-dimensional model for illustrating divergence between the two input models is generated. This generated model is also referred to herein as an visualisation model. The visualisation model may be represented solely by the difference raster. In some embodiments, the visualisation model will also include further raster information, for example a reference raster (eg defining to the reference topography), so that the divergence may be illustrated in the context of a reference surface. In addition or instead of the reference topography, the visualisation model may include the reference elevation topography raster. Thus, in addition to displaying information derived from the difference in calculation, the visualisation model includes elevation values for displaying either the elevation map or the reference elevation topography, or a mixed elevation topography that displays both input models (or parts of both input models) simultaneously.

The spatial coordinates defined the raster or rasters may be sufficient to determine the 3-dimensional visualization model, if downstream processing is configured to render a 3D image based only on these spatial coordinates. However, in some embodiments, the 3-dimensional visualisation model will also include further information defining how to render the 3-image from the spatial coordinates.

Once the 3-dimensional visualisation model has been generated, a 3-dimensional visualisation of the visualisation model is performed to enable a person to easily assess locations in the area of interest which are respectively above, below and on-grade with respect to the reference elevation topography. The visualisation also provides a visual indication of the volume of worksite material (ie, earth material) above the reference elevation topography (more specifically, the volume above grade) compared with the volume of worksite material below the reference elevation topography (more specifically, the volume below grade).

The visualisation model is sent to a visualisation system at step 16 to generate image data. At step 17, the visualisation system receives the visualisation model, including the dataset of elevation values defined therein, and generates an image portraying the 3D visualisation model for a selected viewing angle (above or below horizontal) and a selected orientation (by varying the longitude/latitude viewing position) with respect to the area of interest. The image is rendered by determining colours (step 18) for respective points in the image to portray the 3-dimensional aspect of the image and to visually represent altitudes respectively corresponding to at least some of the elevation values. This rendering process results in the generation of image data, such as a bitmap, at step 19. At step 20, the image data is sent to graphics hardware to process and display an image represented by the image data. Optionally, the generated image may present only a representation of the elevation values, thereby ignoring the difference raster in the visualisation model. For example, the image may optionally illustrate just the reference elevation topography. For such situations, the generation of the model data at step 14 is optional. In this case, the determined dataset used to illustrate elevations may optionally be limited to the reference raster. The determined dataset may in this case be sent, by step 15, to the visualisation system without generating a 3D model that includes a difference raster. In other embodiments, the determined dataset used to illustrate elevations may form only a part of the visualisation model.

Figure 2:
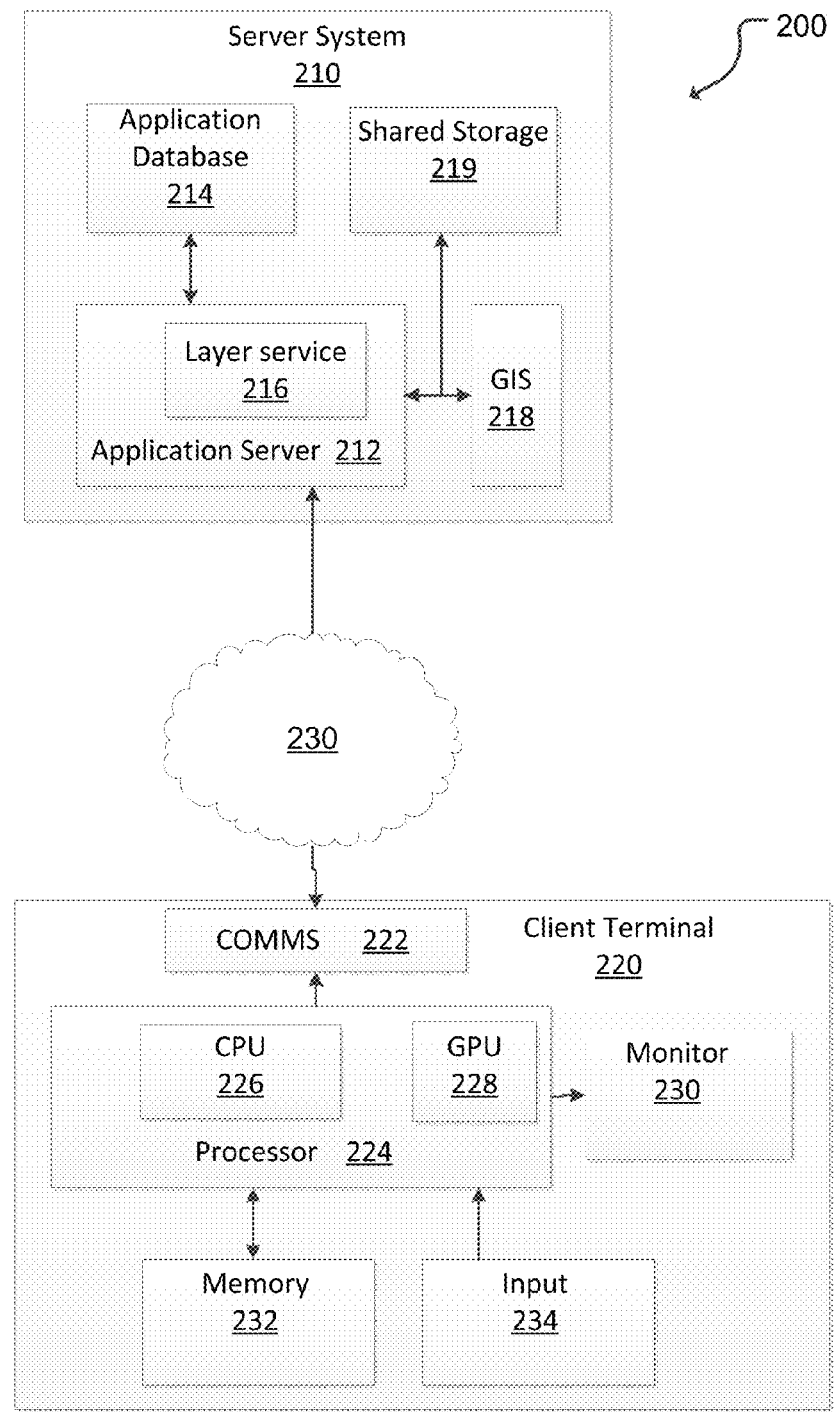
FIG. 2 illustrates a conceptual diagram of a system for performing the computer-implemented method of FIG. 1.

FIG. 2 shows a block diagram of an exemplary computing environment 200 that may be used to implement process 10. The computing environment includes a server system 210 in communication with a client terminal 220 via network 230; such as the internet. The server system 210 includes a processing system and memory system in the form of application server 212 which hosts a web application accessed by client terminal 220. The web application may for example be CAT® Minestar™ running a software component called "Terrain", which is specifically designed for managing drilling, dragline, grading and loading operations. The web application utilises application database 214 which stores information for running the web application program. The application server includes a layer service 216 for managing files utilised by a geographic information system (GIS) which is operated via the application server 212. A shared storage database 219 is accessible by both the layer service 216 and the GIS 218, and stores topographic data and design files such as the two input elevation models and any other elevation models which may optionally be selected, read or updated. Thus, the storage database 219 may include a raster file defining the current elevation map of the worksite or a portion of the worksite, a vector file defining the intended design, and archived elevation maps representing measurement-based topography maps for the worksite at previous times.

The storage database 219 further stores the difference file in raster format, once it has been determined. The difference file is generated by the GIS, which calculates the difference file once a user selected the elevation models upon which a work status visualisation is to be based. The application database 214 and shared storage database server 219 may be stored on the memory system of the application server 212. In other embodiments, at least the shared storage database may reside in a separate storage server.

The files stored on the database 219 may be accessed by a client via client terminal 220 such as a personal computing device or laptop. In other embodiments, a tablet or smart phone may act as the client terminal. In the embodiment illustrated in FIG. 2, client terminal 220 has a communications port 222 for communicating with application server 212, and a processor 224 comprising a central processing unit (CPU) 226 for operating a web browser to interface with application server 212. Client terminal 220 acts as a visualisation system for generating an image of the 3D visualisation model. In other embodiments, however, the visualisation system may performed by the same computer that generates the 3D visualisation model data. For example, in such embodiments, the client terminal 220 may include some or all of the components of server system 210, with the processing and memory functions of the application server being performed by processor 224 and memory 232 of the client terminal 220.

Client terminal 220 includes processor 224 also has a graphics processing unit (GPU) 228, integrated onto the CPU die or as an auxiliary processing circuit, for processing graphics information. The GPU 228 generates data to be displayed on a monitor 230 to provide a visual display of the web browser and the image of the 3D visualisation model in the browser. Memory 232 stores instructions that configure the central processing unit 226 to operate the web browser and plug-in software, such as Adobe Flash or Flex, to enable the browser to interpret graphics information sent from application server 212. The interpretation of the graphics is also enabled by a 3D framework in the form of an application-specific software plug-in stored in memory 232. Client terminal 220 also includes a user input 234 to enable a user to enter information on, and interact with, the web browser, allowing the user to select elevation model files for work status analysis and to select the projected view of the 3-D generated image of the visualisation model.

To operate process 10 in computing environment 200 a user uses client terminal 220 to access the web application on a website, hosted by application server 212. The user logs in to an account specific to that user, giving them access to recorded elevation map and design topography files, and any stored difference files that have already been generated. The user selects a recorded elevation map and a reference elevation topography to be compared in process 10. Application server 212 receives identification data which identifies the selected files and uses layer service 216 to identify the storage location of the files and prepares them for access by the GIS 218. Based on the identified location, GIS 218 loads the selected files for processing. The GIS 218 subtracts the elevation values for each of the locations defined by the raster grid data in the selected files, as has already been described. The resulting difference topography is then saved as a difference file on shared storage database 219. The difference file may also include data representing the total volume of earth above the design topography, ie, based on a sum or average of all elevation values in the difference file that are more positive than a specified positive tolerance. The total volume of earth needing to be filled, is also calculated based on the average or sum of elevations having a negative value more negative than the specified negative tolerance.

Figure 3:
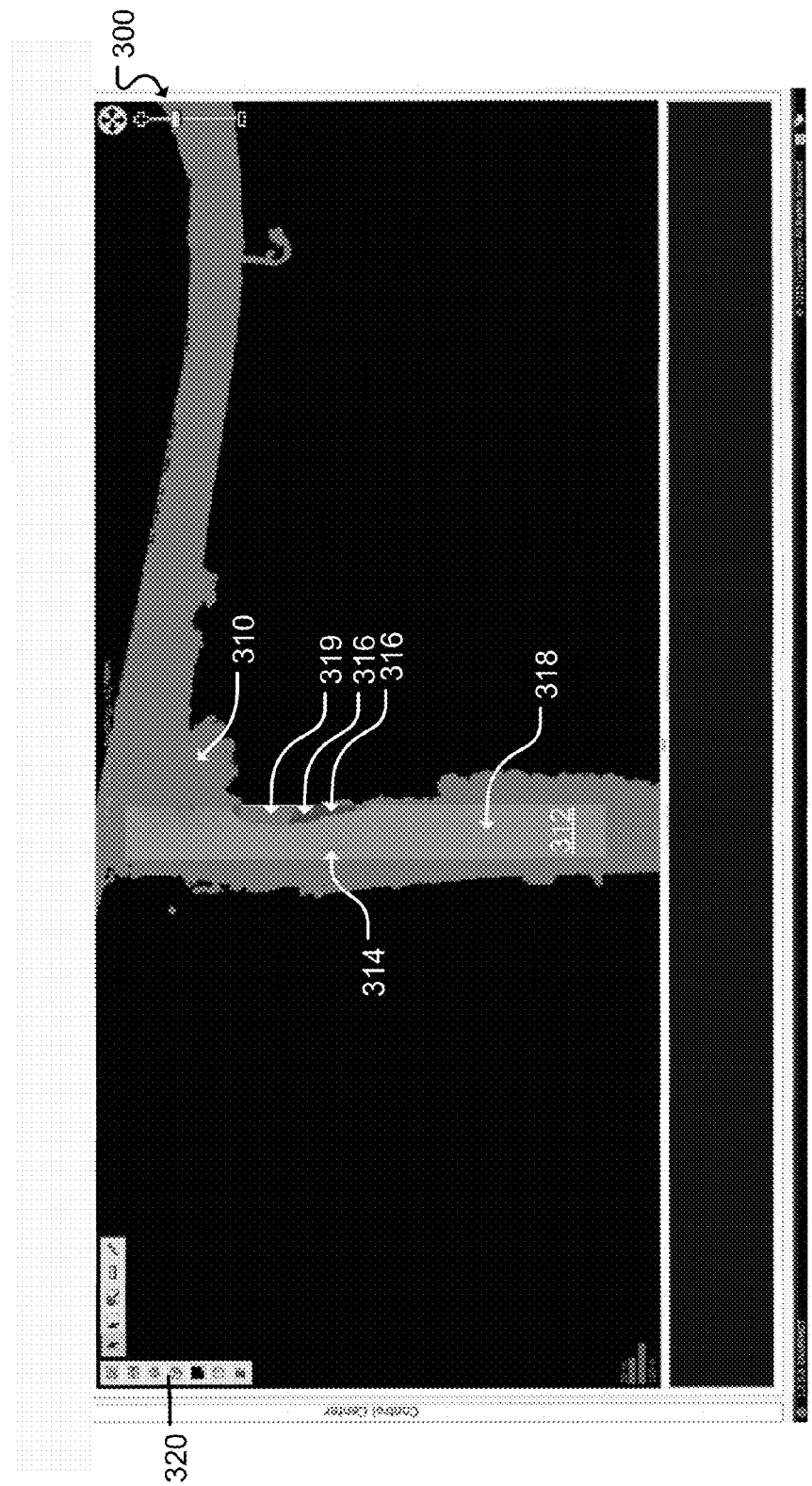
FIG. 3 illustrates a user interface for a software program, the user interface illustrating a plan view of a worksite and an area of interest in the worksite for which an intended topography has been designed.

The difference raster and, optionally, one or both of the input rasters being compared in the difference raster, are sent to the web browser on client terminal 220. Initially, the topographic information represented by the rasters are presented on monitor 230 as a 2-dimensional plan, view of the worksite, or the portion(s) of the worksite represented by the rasters. FIG. 3 illustrates a user interface 300 showing the 2-dimensional view. The area of the worksite represented by the recorded elevation map is represented by a first coloured map region 310 (eg. purple) on the user interface. The area of the worksite corresponding to the design topography is represented by a second map region 312, which in FIG. 3 is rectangular. Any portions 314 in the second map region 312 where the height represented in the difference raster is greater than a maximum allowable height above the height of the design is represented as being above grade and illustrated in a second colour (eg. in red). Any portions 316 within the second map region 312 where at which the height of the mine worksite is below a maximum specified height beneath the design height is represented by a third colour (eg. blue) since they are below grade. Any portions 318 within the second map region 312 that the difference file has determined to be between the maximum specified height above the design and the maximum specified height below the design are determined to be "on grade" and are represented by a fourth colour (eg. green). A fifth colour or range of colours is used to illustrate any portions 319 of the design topography area for which no difference information is available (eg. because these regions may not have recorded elevations in the elevation map). The fifth colour or colours is selected from a colour scale according to present disclosure, to depict altitude. In the example in FIG. 3, the colour is aqua.

Figure 4:
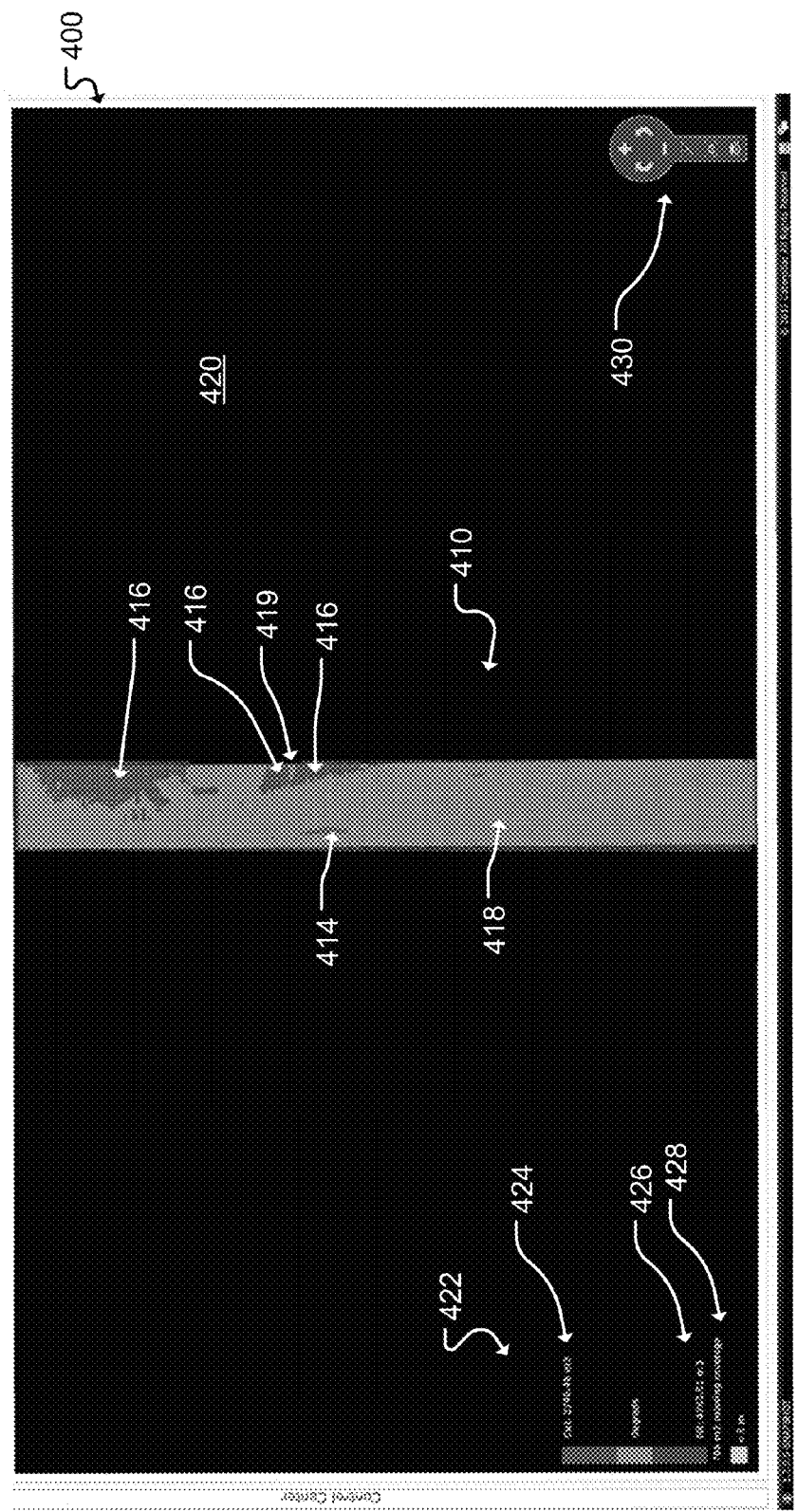
FIG. 4 illustrates a user interface illustrating a 2-dimensional, plan view of the area of interest shown in FIG. 3.

The user can configure the application server 212 to enter a 3D mode of visualisation to present the user with a 3D visualisation of the design area by selecting 3D icon 320. The initial view 400 in 3D mode is illustrated in FIG. 4. View 400 shows the area of interest 410 which corresponds to the area associated with the designed topography. The area of interest 410 is displayed on a background 420, which is generally black but may be a different nominated colour. This initial view 400 is still a 2-dimensional, plan view of the area of interest but may be manipulated by the user to present a 3-dimensional projection of the determined 3D model of the area of interest 410. The 3D mode uses the same colouring scheme as described in relation to the 2D mode in FIG. 3. Therefore, portion 414 illustrated in red denotes a region at which the worksite's elevation is above grade, blue portions 416 illustrate areas of the worksite that have elevations below grade, and green portions 418 illustrates areas of the worksite that are on grade. The 3-dimensional shapes of the intended design and the actual worksite surface are not visible in this view because the projected perspective is in plan, and therefore appears flat. The intended design for the worksite is nonetheless represented in the displayed image in a distinguishing colour (eg. aqua). However, in FIG. 4, the aqua colour is only visible where elevation data is missing from the elevation map of the worksite, as shown at 419. Optionally, the illustrated intended design is coloured according to a colour scale for depicting an altitude or range of altitudes corresponding to the intended design, as described herein. Thus, in FIG. 4, the colour aqua denotes a certain altitude as defined by the colour scale.

Also presented in this view 400 is a colour legend 422 to illustrate which colours correspond to above grade, on grade and below grade portions. The above grade portions represent the areas of land that needs to be cut from the worksite for the worksite to be on grade, according to the design specifications. The total volume of above grade land is determined from the difference raster and is represented as the cut volume 424. Similarly, the volume beneath the design, between the design and the worksite surface, represents the volume of land needing to be filled to build the worksite surface up to the specified grade level. This volume is represented as fill volume 426, and is similarly determined from the difference raster. The total area for which elevation data is missing is represented by missing coverage area 428. A navigation icon 430 enables the user to rotate the view away from plan view to present a 3D view of the 3D model.

The 3D model is presented to the client terminal 220 in the form of rasterised difference data from the difference file. Also presented are any elevation map or design topography rasters that may be needed to for illustration in the user-requested 3D model. The presence of the elevation map or design topography rasters in the 3D model is optional depending on the requested visualisation. Generally, at least the reference topography (eg. design topography) will be provided with the difference raster. In this way, the divergence in elevations associated with difference raster can be viewed within the context of the design topography. However, optionally, the displayed 3D model may be based solely of the difference raster, so that the displayed 3D model illustrates divergence with respect to a normalised or flattened representation of the design surface topography.

To enable 3D rendering of the 3D model, the application server also sends index buffers and vertex buffers to the client to define how to interpret the raster information in three dimensions and, accordingly, how to render the 3D image to present a 3D visualisation in accordance with the client's visualisation request.

Initially, the client CPU 226 converts the height map information, defined by the provided rasters, into a collection of triangles defined by vertices and edges that collectively form a polygon mesh. Plug-in software on the web browser provides a library to interpret vertex buffers, index buffers and shader programs sent from the application server to define how to render the 3D object to create a 3D visualisation of the image. The 3D model includes metadata for each vertex to indicate what each vertex represents, so that the shaders can render the image accordingly by determining the colour of each point in the image.

For each type of shader, the CPU 226 sends corresponding vertex buffers and index buffers to the GPU 228 to generate data defining the colour of each pixel so as to format the monitor 230 to display the appropriate 3D visualisation. The colour of each pixel is generally determined collectively by red, green and blue parameters that define colour according to the Red, Green Blue (RGB) colour model. However, colours are also representable by other colour models, such as Hue, Saturation, Brightness (HSB) colour model (also referred to as a Hue, Saturation, Value colour, HSV, colour model), or a Hue, Saturation, Lightness (HSL) colour model. It is generally convenient to discuss colours within the framework of the HSB and the RGB colour model. However, transforms are well known in the art to convert a given colour from one colour model to another colour model. To avoid confusion, the term "lightness" as used herein is to be understood in as lightness in a general sense, rather than necessarily being limited to the technical definition of the Lightness parameter used in the HSL model.

In the present disclosure, the shaders are configured to colour at least part of the generated image to depict elevation values in a colour that is representative of their altitude. The selection of colours, as controlled by the shaders, is now described.

Colour scale for illustrating elevation

Figure 5:
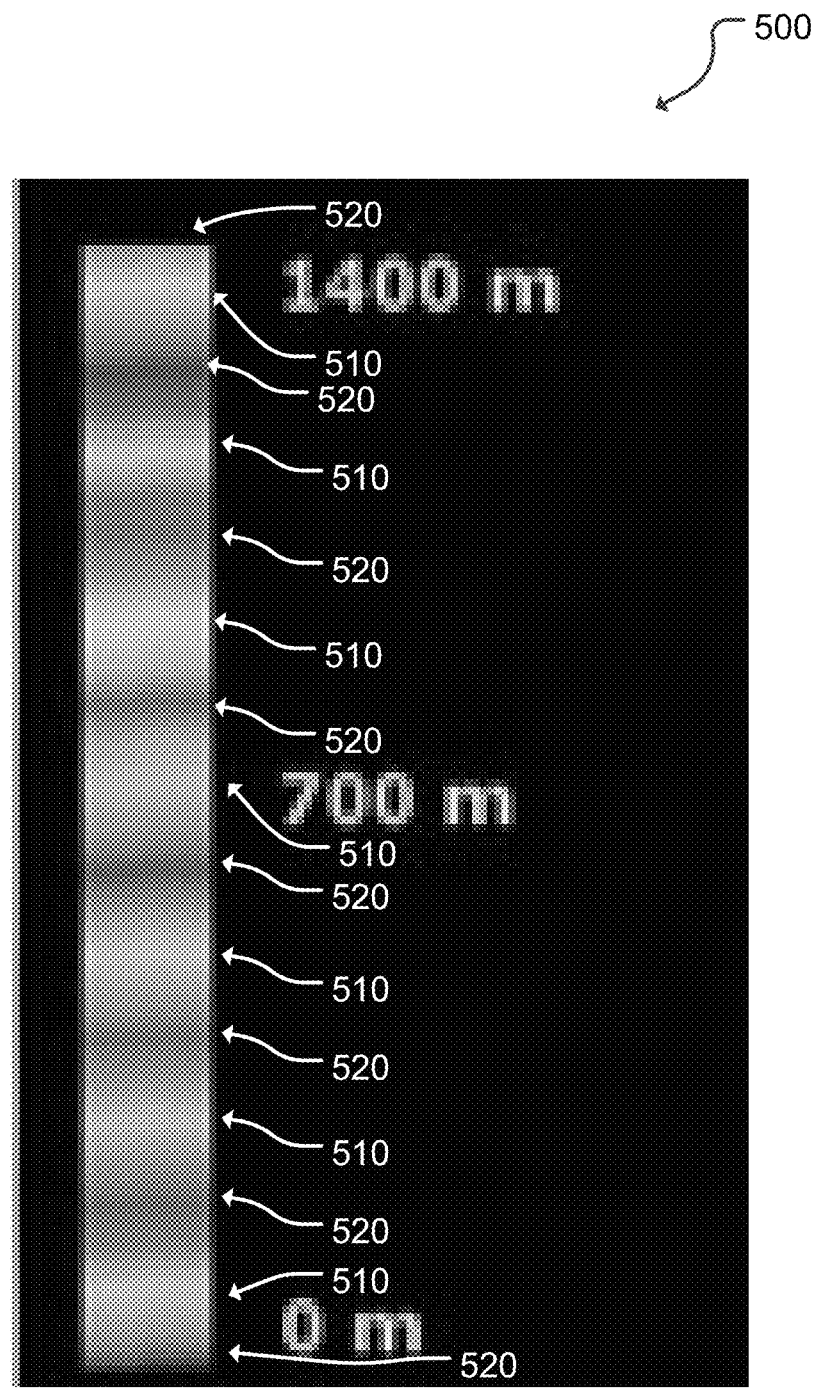
FIG. 5 illustrates an embodiment of a colour scale in accordance with the present disclosure.

As has been discussed, processor 224 of FIG. 2 receives, from server system 224, elevation values for a visualisation model for the area for interest in the mine worksite. Processor 224 also receives shaders from server system 210. Using this information, the processor 224 determines the colour for the elevation values by determining the colour in accordance with a scale of colours or "colour scale" 500, as indicated in FIG. 5. The colour scale 500 maps a defined range of altitudes to a palette of colours that varies continuously and smoothly across the range of altitudes. In this way each elevation value or altitude has a corresponding colour. The defined range may be between a defined lower absolute altitude and a defined upper absolute altitude. In colour scale 500, the defined range is from 0 to 1400 meters.

In the colour scale, each colour is definable by (i) a hue and (ii) at least one parameter for influencing at least one of a lightness and a darkness of the colour, eg saturation and/or brightness in the HSB colour model. The colour scale is defined to progress through a spectrum of hues across the defined range of altitudes. In the exemplary embodiment shown in FIG. 5, the colours are defined by 28 colour coordinates, evenly spaced along the altitude range. These coordinates are as indicated in table 1, below:

TABLE 1

| colour scale coordinates | | | | | | | |
|---|---|---|---|---|---|---|---|
| Altitude | Red | Green | Blue | Hue | Saturation | Brightness | Colour name |
| 0 | 51 | 51 | 51 | | 0 | 20 | charcoal (dark) |
| 50 | 224 | 160 | 255 | 280 | 37 | 100 | plum |
| 100 | 238 | 204 | 255 | 280 | 20 | 100 | pale plum (light) |
| 150 | 144 | 144 | 255 | 240 | 44 | 100 | purple |
| 200 | 112 | 128 | 144 | 210 | 22 | 56 | grey-blue (dark) |
| 250 | 112 | 192 | 224 | 198 | 50 | 88 | blue |
| 300 | 187 | 221 | 234 | 198 | 20 | 92 | baby blue (light) |
| 350 | 112 | 196 | 196 | 180 | 43 | 77 | teal |
| 400 | 112 | 144 | 112 | 120 | 22 | 56 | olive (dark) |
| 450 | 96 | 224 | 192 | 166 | 57 | 88 | turquoise |
| 500 | 187 | 234 | 222 | 166 | 20 | 92 | pale turquoise (light) |
| 550 | 128 | 216 | 96 | 104 | 56 | 85 | fern green |
| 600 | 80 | 128 | 80 | 120 | 38 | 50 | medium green (dark) |
| 650 | 128 | 208 | 128 | 120 | 38 | 82 | emerald green |
| 700 | 183 | 229 | 183 | 120 | 20 | 90 | pale green (light) |
| 750 | 192 | 224 | 0 | 70 | 100 | 88 | yellow-green |
| 800 | 128 | 128 | 64 | 60 | 50 | 50 | yellow-brown (dark) |
| 850 | 240 | 224 | 0 | 56 | 100 | 94 | yellow/gold |
| 900 | 239 | 236 | 191 | 56 | 20 | 94 | pale yellow (light) |
| 950 | 225 | 160 | 0 | 44 | 100 | 88 | golden brown |
| 1000 | 160 | 128 | 112 | 20 | 30 | 63 | tanbark (dark) |
| 1050 | 255 | 96 | 96 | 0 | 62 | 100 | salmon |
| 1100 | 255 | 204 | 204 | 0 | 20 | 100 | peach (light) |
| 1150 | 255 | 64 | 160 | 330 | 75 | 100 | magenta |
| 1200 | 128 | 64 | 128 | 300 | 50 | 50 | deep violet (dark) |
| 1250 | 255 | 128 | 255 | 300 | 50 | 100 | violet |
| 1300 | 255 | 204 | 255 | 300 | 20 | 100 | pale violet (light) |
| 1350 | 160 | 160 | 160 | | 0 | 63 | grey |
| 1400 | 0 | 0 | 00 | | 0 | 0 | black (dark) |

Figure 6:
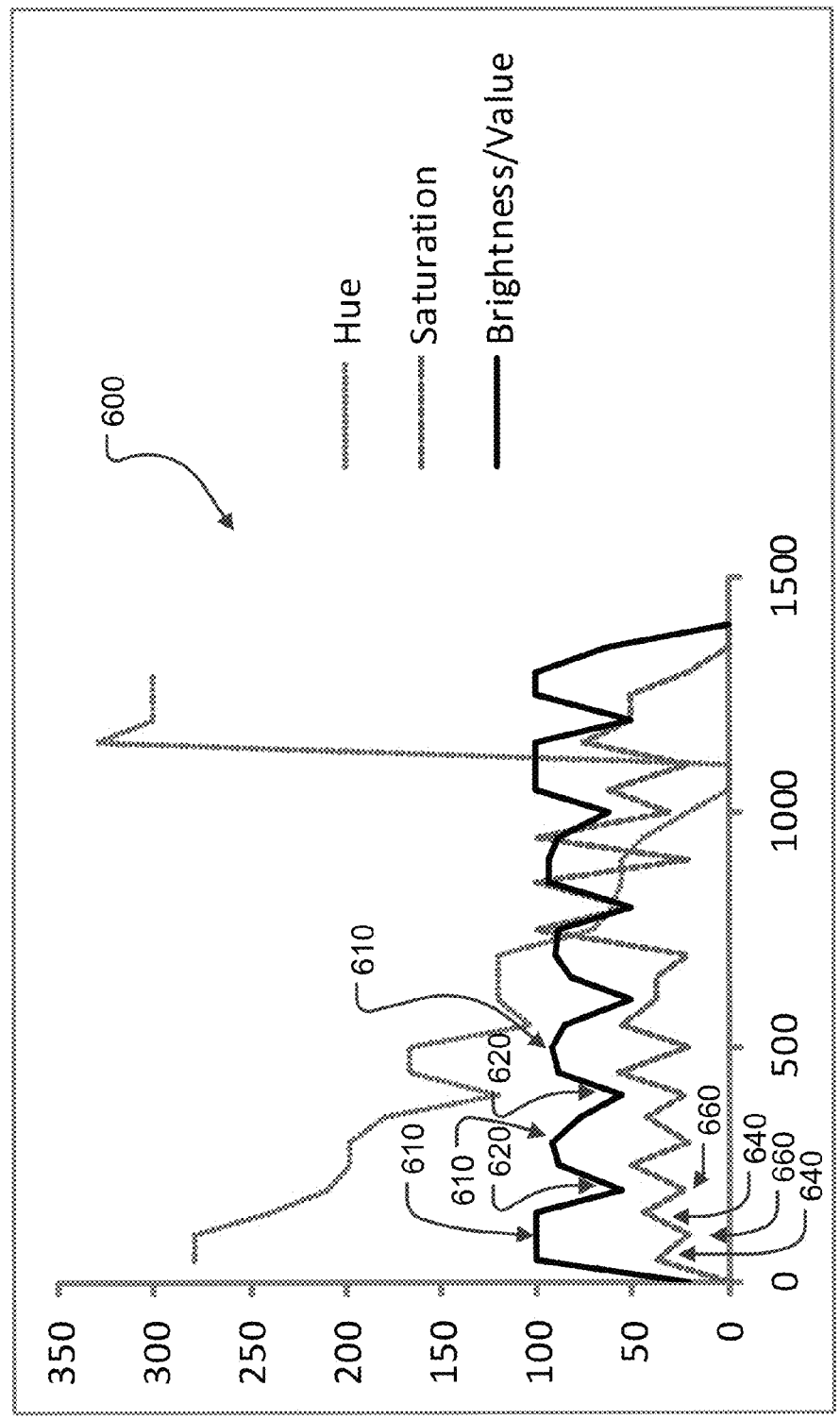
FIG. 6 illustrates another embodiment of a colour scale in accordance with the present disclosure, depicted in a graphical format.

In Table 1, the listed colour names are provided only as a general indication of the colour to aid explanation of the scale. As these names can be interpreted in many different ways, the actual colour is precisely defined by either the RGB coordinates or the equivalent HSB coordinates. Colours between the colour coordinates are derived by linearly interpolating between the RGB coordinates, in RGB space, producing the colour scale 500. In other embodiments the interpolation may be in another colour space such as the HSB colour space, as illustrated in FIG. 6. In further embodiments, the interpolation may be non-linear. In FIG. 6, the hue, saturation and brightness parameters for colour scale 600 are represented graphically on the Y axis with respect to altitude on the X axis. The colour scale 600 is the same as colour scale 500, but with linear interpolation in HSB space between the 28 colour coordinates, rather than in RGB space. In many hardware and software embodiments, colours are handled in terms of RGB coordinates. Therefore, in practice, programs may implement either scale 500 or 600 referring to RGB coordinates alone, bearing in mind that each colour is nonetheless representable in terms of HSB coordinates.

At an altitude of 0 meters, the colour in colour scale 500 corresponds to dark charcoal, which is nearly black (saturation is 0 and brightness is 20). The hue is undefined since the saturation is 0. Over the next 50 meters, the colour gradually progresses to a plum colour, with a hue value of 280 degrees (hue being measured between 0 and 360 degrees). From 50 meters to 1300 meters, the hue gradually progresses, without discontinuities to a value of 0 (equivalent to 360) at 1050 meters. The hue then continues to decrease from 360 degrees, without discontinuities back through a value of 300 degrees at 1200 meters, generally completing the transition through the whole spectrum of hues. From 1300 meters to 1400 meters, the colour transitions from pink, through grey to black, hue being undefined for grey and black since saturation is 0. In this embodiment, colour scale 500 starts and ends at the violet end of the hue spectrum, but in other examples, the hue spectrum may be rotated to start and end at a different part of the spectrum.

As can be seen in Table 1, the colours oscillate between light colours and dark colours (respectively corresponding to 510 and 520 in FIG. 5). As colour progresses through the full, 360 degree spectrum of hues, the lightness of the colour fluctuates between light and dark colours as a result of changes in at least one of the other parameters in the colour model. In other words, at least one parameter changes to lighten and darken the colour in a cyclical manner across the defined range of altitudes. In some embodiments one cycle of lightening and darkening of the colour corresponds to a change in altitude between 100 and 300 meters. However, for the colour scale 500 illustrated in FIG. 5, the cycle of lightening and darkening of the colour corresponds to a change in altitude of 200 meters. This means that every 200 meters, there a peak in colour lightness and every 200 meters, interspaced between the lightness peaks are troughs in colour lightness (ie peaks in colour darkness). The lightness peaks do not progress to white, nor do those darkness peaks between the lightness peaks progress to black. In this manner, each light and dark peak has its own unique colour so that it can be visually distinguished from the other peaks in lightness or darkness.

By oscillating between light and dark colours as the hue changes, more colours are present in the colour scale than would be available by changing hue alone. This provides the colour scale with increased resolution for showing small changes in altitude compared with the relatively large spread of altitudes covered by the scale.

As can be seen from FIG. 6, which tracks brightness with respect to altitude, the brightness parameter repeatedly increases and decreases between first peaks 610 and first troughs 620 that are alternatingly spaced across the range of altitudes. The saturation parameter increases and decreases between second peaks 640 and second troughs 660 that are alternatingly spaced across the range of altitudes. For at least a portion of the range of altitudes in the colour scale, there are a plurality of increasing and decreasing cycles of the brightness parameter, with each cycle lasting a first period, and simultaneously, the saturation parameter increases and decreases according to a second period that is half the first period. This is illustrated in FIG. 6 for altitudes between 0 and 600 meters. In the exemplary colour scales 500 and 600 the defined altitude range of the colour scales spans between 0 and 1400 meters because this has been found to provide sufficient resolution for planned applications in mining. These altitudes may be with respect to sea level or some other reference altitude. The minimum and maximum altitudes that define the range of altitudes in the colour scale 500, 600 is configurable by entering these range boundaries into client terminal 220. In some embodiments, it may be desirable to provide a stretched or shortened version of the colour scale. In such embodiments, the altitudes may simply be multiplied by an appropriate scaling factor. For example, for a scale covering a span of X meters, the altitudes referred to in the examples herein may be multiplied by X/1400.

Illustrating altitudes according to the colour scale

Using colour scale 500 or 600, elevation values may be illustrated in an image corresponding to an area of interest of a mine worksite. The image may be generated from data that includes a plurality of elevation values within a data range, the elevation values defining an elevation topography for the area of interest. The image portrays the elevation topography and illustrates at least a portion of the elevation values according to the colour scale. This generation of the image is achieved by determining, by a selection from a database, a first dataset consisting of some or all of the data. The plurality of elevation values of the first dataset define an elevation topography for a first area of interest area of a mine worksite. The plurality of elevation values are within a first data range that spans a minority of the defined range. The selection may further include defining said defined range of altitudes by entering minimum and maximum altitudes for the defined range. In alternative embodiments, the defined range of altitudes may be defined before determining the first dataset, or may be fixed.

For each of the at least a portion of the elevation values, a colour is determined according to the colour scale, to visually indicate the elevation value. An image is then generated corresponding to the first area of interest. More, specifically, client terminal 220 receives the elevation values and generates a polygon mesh from the values. Vertices of the polygon mesh include metadata, which include the elevation values. Alternatively, in place of the elevation values themselves, the metadata may include absolute altitude parameters if the elevation values need to be converted to some other frame of reference. This may be the case, for example, if the elevation values are measured with respect to a frame of reference in a mine, but the desired altitude to illustrate is with respect to a different frame of reference, eg sea level.

Figure 8:
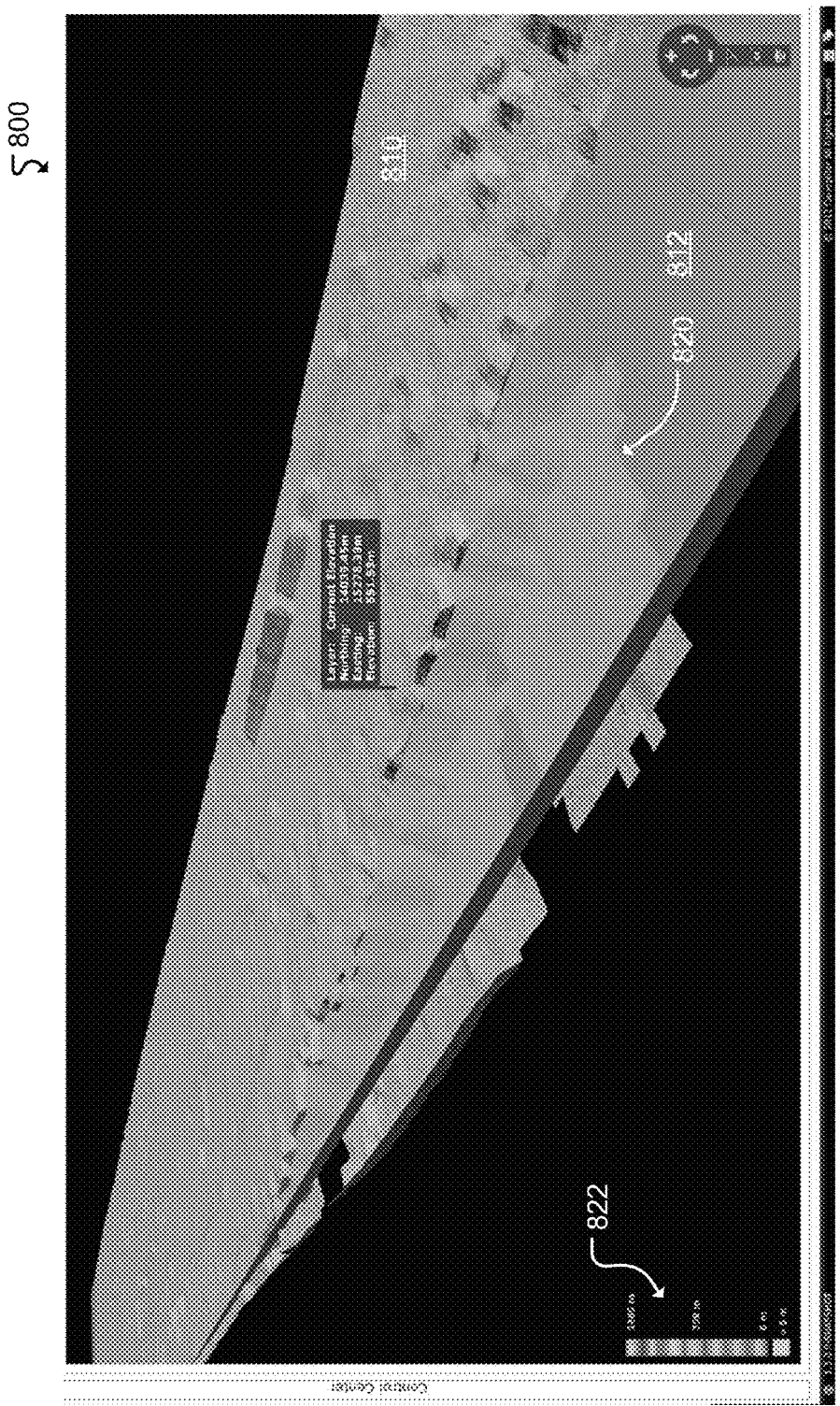
FIG. 8 illustrates an image portraying another 3-dimensional view of the area of interest to illustrate the divergence, in which elevations within the area of interest are coloured according to a colour scale that is in accordance the present disclosure.
Figure 9:
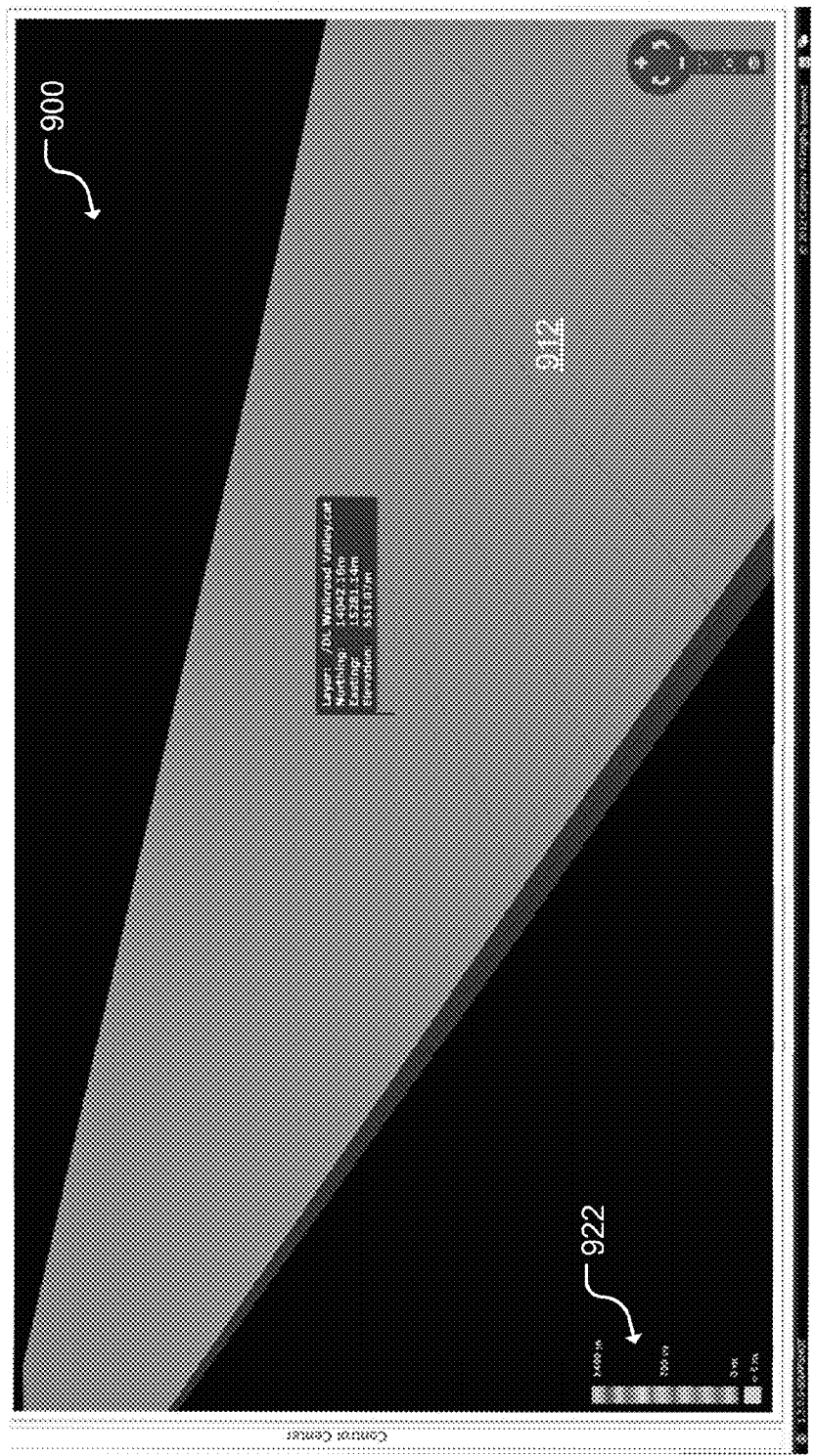
FIG. 9 illustrates an 3-dimensional view of a reference topography for the area of interest shown in FIG. 8.
Figure 10:
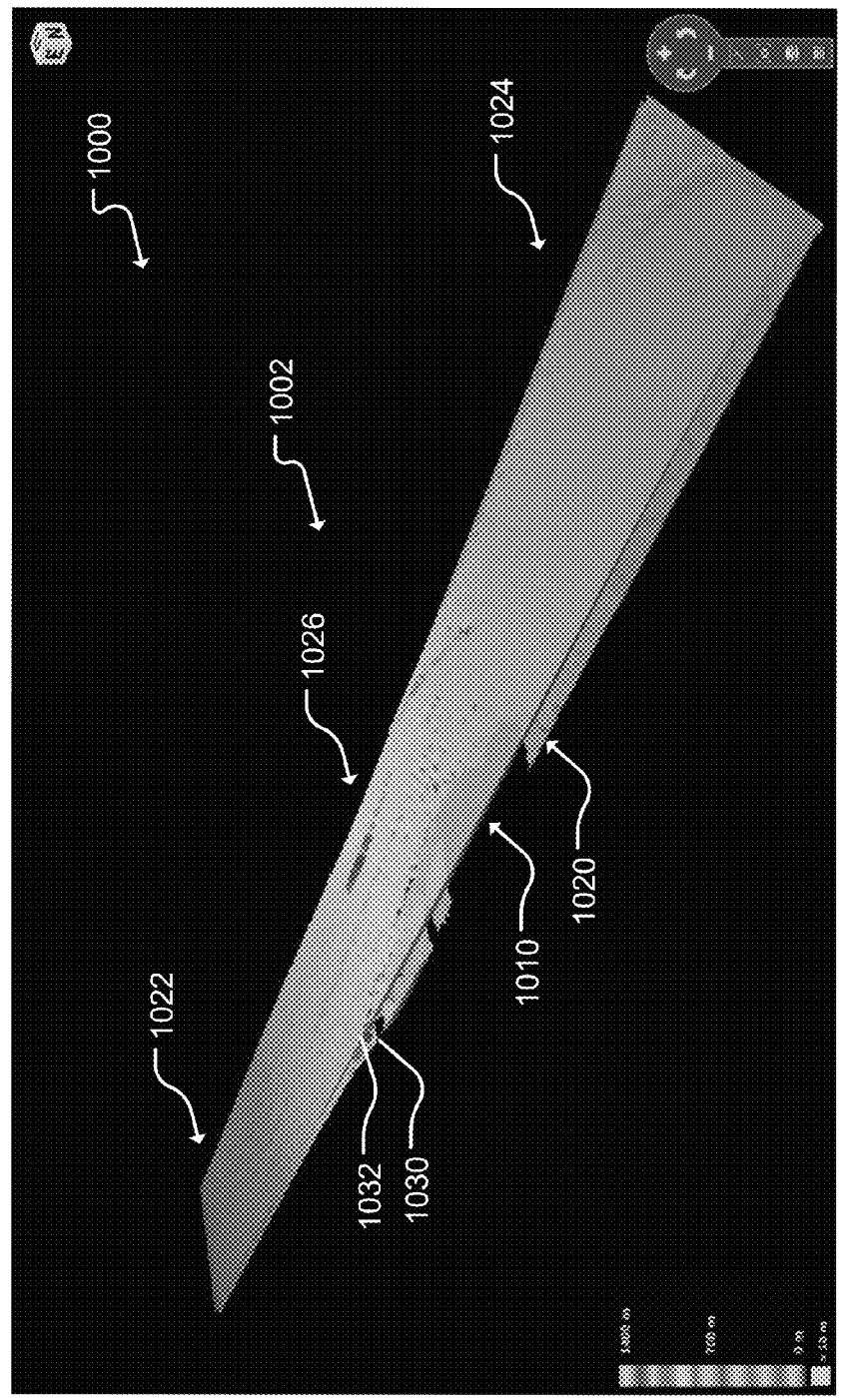
FIG. 10 illustrates an image portraying a 3-dimensional view similar to FIG. 8, but for an area of interest at a different altitude and elevation gradient to FIG. 8.

Based on the colour scale, shader programs then interpret how to colour the altitude information (defined by or with respect to the elevation values) in the meta data. The colour scale may be used for all of the elevation values. However, in some embodiments, only some of the vertices will need to display the elevation values, thus the colour scale might be applied only to a portion of the elevation values in the 3D model. For example, in FIG. 7, the reference topography 712 is only visible where it is not covered by the red blue or green block-shaped bars, so it is only needed to use the colour scale where the reference topography is visible. This corresponds with portions 319 and 419 in FIGS. 3, 4. In some embodiments, as illustrated in FIGS. 8-10, the 3D model illustrates at least one elevation model, or a mix or two elevation models, over the entire surface of the model. For these embodiments, the entirety of the 3D model may be shaded based on the colour scale.

INDUSTRIAL APPLICATION

Figure 7:
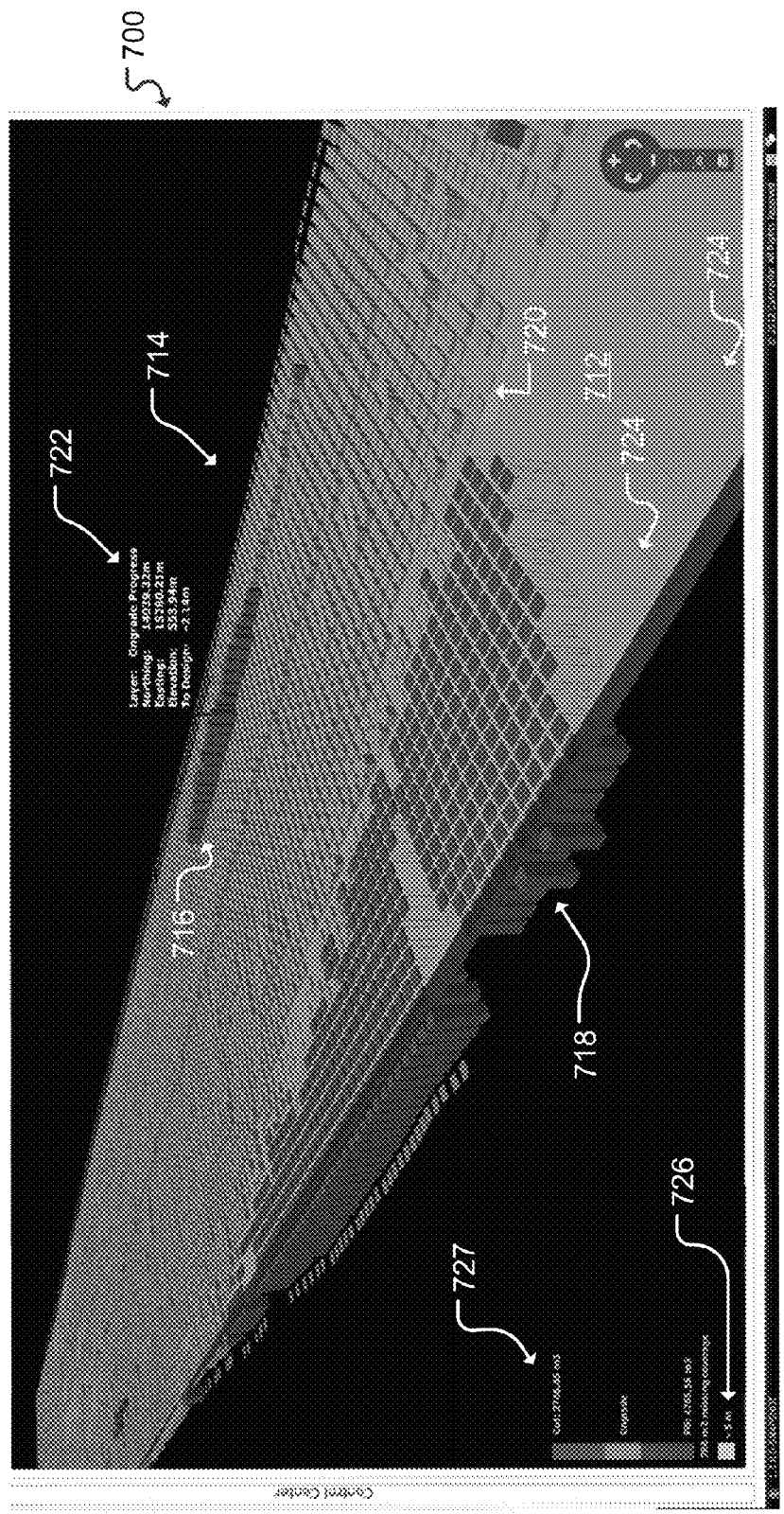
FIG. 7 illustrates an image according to an embodiment of the present disclosure, portraying a 3-dimensional view of the area of interest, illustrating divergence between an elevation map for the worksite and a reference elevation topography.

FIG. 7 illustrates an exemplary embodiment of a 3D visualisation of the 3D model that was illustrated in a 2D plan view in FIG. 4. As can be more clearly visualised in FIG. 7, the model is based on rasterised data for the designed elevation topography 712 superimposed with raster data, calculated by the GIS, that represents the differences in elevation between the designed elevation topography and the elevation map of the worksite. The rendered image 700 of the 3D projection illustrates the divergence between the measured elevation map and the reference (designed) elevation topography by illustrating block-shaped bars that extend from designed surface 712. The topography of the designed surface 712 is portrayed in the image 700. Where the designed surface 712 cannot be directly seen, it is implied by the divergence information illustrated in the image. The designed surface, where visible, is coloured according a colour scale (eg in this case colour scale 500) to indicate the altitude(s) of the designed surface. Upwardly extending bars 714 represent positions in the worksite at which the worksite elevation is greater than the designed elevation. The length (i.e. height) of these bars is indicative of the magnitude of the determined difference in elevation. However the height of the bars is also factored according to the perspective of the 3D projection (i.e. bars further away from the projected viewing position being shorter than bars closer to the viewing position). Bars that represent differences greater than a specified positive deviation from the design elevation are coloured red as indicated at 716 so as to show that these divisions are above grade. Similarly, bars below the design surface which correspond to differences in elevation that diverge from the design elevation by more than a negative deviation limit are indicated in blue as shown at 718. Bars having a magnitude between these positive and negative elevation deviation limits are indicated by green bars 720. Geographic information corresponding to each of the bars can be viewed by placing a cursor over the bar. A geographic information summary 722 displays for that bar, whether the mine site elevation is above grade (requiring cutting), on grade, or below grade (requiring filling). The geographic information summary 722 also displays the associated location coordinates and elevation of the worksite with respect to a positional frame of reference associated with the worksite. The summary 722 also displays the required change in elevation (eg. by cutting or filling the worksite) that is required to bring the worksite elevation within the specified deviation to be considered on grade.

Since the difference elevation superimposed on the reference elevation equals the actual elevation of the worksite, the image 700 in effect displays both the reference topography and the recorded elevation map simultaneously and superimposed on one another. The illustration of reference topography 712 includes spaced line markers 724 to indicate the scale of the displayed model. The distance between adjacent line markers is indicated at 726 in legend 727. To enable both positive and negative deviations to be viewed simultaneously despite presence of the reference surface, the reference surface 712 is presented as a semi-transparent surface. FIG. 8 illustrates an alternative 3-dimensional visualisation of the divergence between the elevation topography of the mine worksite and the reference, design topography. Image 800 similarly displays the elevation map of the mine worksite 810 superimposed on the reference topography 812. In contrast with FIG. 7, however, the elevation map 810 is illustrated by applying a different set of vertex buffers, index buffers and shaders to the raster data sent to the client terminal 220. This set of vertex and index buffers and shaders render the image of the 3D model to portray a surface view of the worksite with rough textured and continuous rendering, rather than the series of discretely spaced vertical bars illustrated in FIG. 7. As can be seen at 820, regions of the worksite surface 810 beneath the reference topography 812 are visible through the semi-transparent visualisation of the reference topography 812. The 3D visualisation of the divergence between the reference surface and the measured elevation map enables as user to gain an appreciation for the distribution of earth material with respect to the designed topography, enabling a user to determine the present status of work. By illustrating the work required to completion, a user may determine how to efficiently move earth material eg. from which region to which region, and to ascertain whether enough earth material is available to be cut and moved from on or above grade areas to fill the areas below grade. In FIG. 7, the portrayal of divergence for areas identified as being on grade (green bars 720) enables a user to ascertain whether material, and how much material may be cut, or added to an on grade location without pushing the elevation at that location outside the specified limits of divergence required to maintain on grade elevation.

The reference surface 812 is the same as reference surface 712 of FIG. 7, so is likewise coloured according to a colour scale 822 (equivalent to colour scale 500) to indicate the altitude across the surface. The colour scale is also applied to elevation values associated with elevation map 810 to similarly provide a coloured indication of altitude. The image 800 also includes the colour scale 822 so that the altitude may readily be determined by a person looking at the reference surface 812. In this embodiment, the colour can be read from scale 822 to determine that the altitude of the illustrated elevation map 810 and reference topography 812 is approximately 700 meters. While the colours of both reference surface 812 and worksite surface 810 are based on the same colour scale, the colours may be modified to show the surfaces 812 and 810 with different respective surface textures. Specifically a smooth surface is presented for the reference surface 812 by having all illustrated elevation values (apart from those at the line markers) in the same colour. A rough surface texture is presented for the worksite surface 810 by darkening and lightening the colour elevation values, a pattern or random distribution over the surface 810. The colour of the elevation values for the surface 810 is further darkened or lightened depending the surface's orientation with respect to a notional light source—it is lightened where it is faces the path of the light source or darkened where it faces away from the light source.

In other embodiments, rather than comparing the current elevation topography of the mine worksite with a reference design, the current topography may be compared with a topography recorded for a previous time. In this manner, the difference information illustrates how much and where work has been done to progress the mine towards the desired topography, from the topography at a previous time recording to the present time recording.

In some situations it may be desirable to view the elevation information for the reference topography only. Accordingly, as illustrated in FIG. 9, image 900 may present a view of the elevation topography for the reference topography 912 only, along with presentation of the colour scale 922. In addition to illustrating an absolute altitude of the topography 912, variations in altitude for the displayed topography 912 may be represented by the colour changes in the image of the topography 912. This is enabled by the high colour resolution provided by the colour scale 822.

The differences in altitude within the displayed topography are more readily apparent in image 1000 in FIG. 10. Image 1000 includes non-plan views of an elevation topography 1002 that includes both reference topography 1010 and elevation map 1020. At the left end 1022 of the displayed topography 1002, the elevation values are displayed to in a magenta colour, which correspond to an altitude of around 1150 meters. On the right end 1024, the displayed topography is a salmon colour, corresponding to about 1050 meters. The image 1000 shows a gradual change between the left and right ends, transitioning through a lightly shaded, peach colour for a region 1026 near the middle of the topography 1002. This allows a viewer to gain an appreciation for any gradients in elevation for the area of interest of the mine site displayed in the image 1000. In embodiments in which the area of interest is a particular road within the mine site, a viewer can determine, based the colours, both the general altitude of the road as a whole and an indication of the gradient of the road. Assessing the gradient can be further assisted by including line markers, like 724 in FIG. 7.

Additionally the colour scale can indicate differences in elevation between the reference topography 1010 and the elevation map 1020. For example, at location 1030 the elevation map 1020 is slightly lower that the corresponding position 1032 on the reference topography 1010. This is reflected in the difference in the respective colours, as location 1030 is more towards a salmon colour compared with the peachy/magneta colour of position 1032. This difference in colour can further assist the assessment of the work status in constructing the road. This difference in colour will be most obvious in embodiments in which the range of elevation values illustrated in the image spans across multiple primary and secondary colours (ie at least two of red, yellow, green, cyan, blue, and magenta), as such use of the colour scale will produce the most discernable differences in colour for relatively small differences in altitude.

Figure 11:
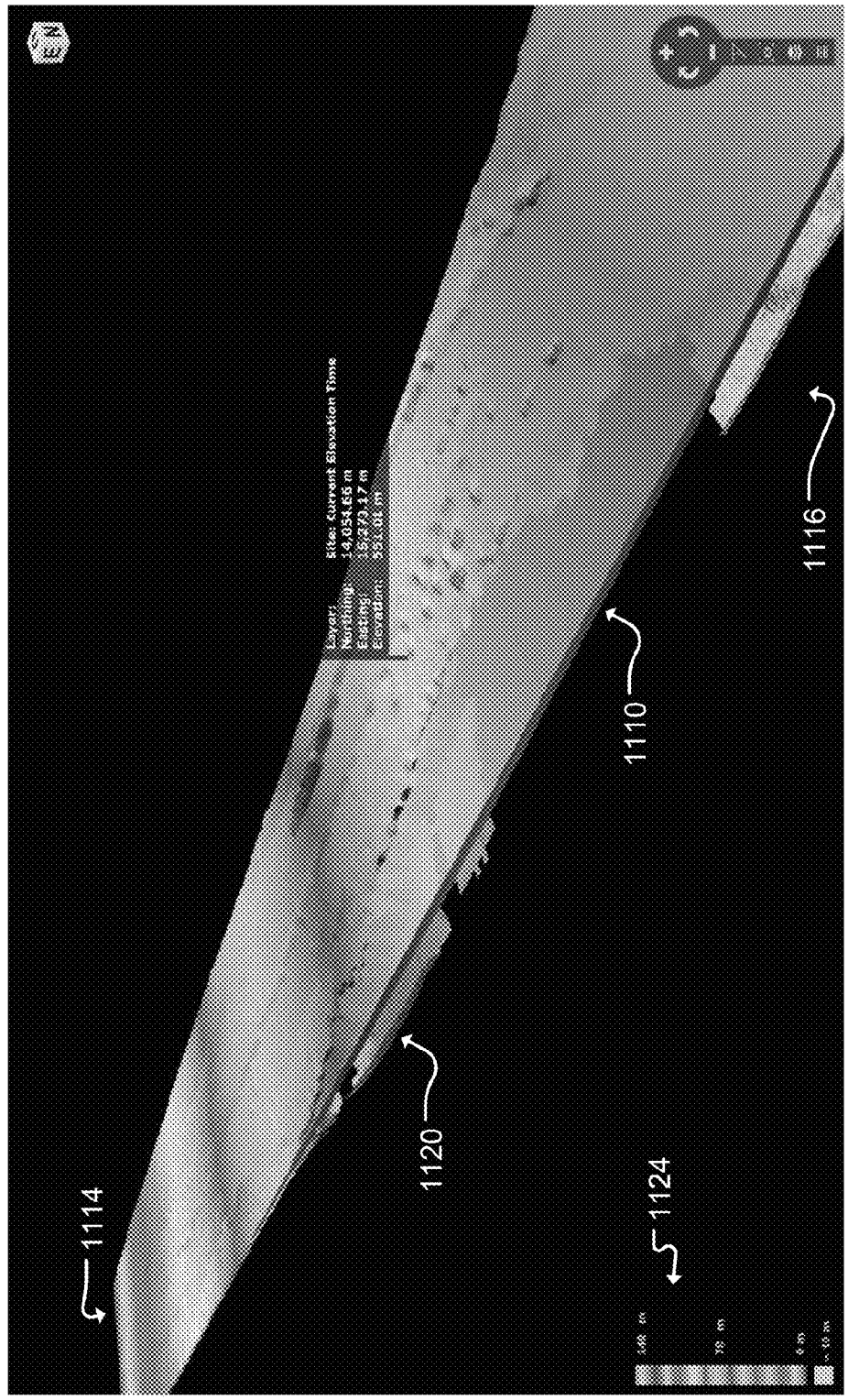
FIG. 11 illustrates an image portraying a 3-dimensional view similar to FIGS. 9 and 10 but for an area of interest having a range of altitudes spanning a larger proportion of the altitudes in the colour scale.

For example the image in FIG. 11 shows a reference topography 1110 and an elevation map 1120. The displayed colours range from magenta, at the left end 1114 of the figure, through to teal (for the reference topography) and to baby blue (for the elevation map) at the right end 1116 of the figure. The colour scale, as shown in legend 1124 ranges from 0 to 140 meters. The legend 1124 shows that the colour scale uses the same spread of colours as colour scales 500 and 600, but spread across 10% of the range in altitudes defined in colour scales 500, 600 (ie 0-1400 m). Therefore referring to Table 1, and factoring in this 10% difference in range, it may be deduced that teal corresponds to about 35 meters and baby blue corresponds to about 30 meters in altitude relative to the reference altitude. It is therefore discernable by the difference in colour that the elevation map is about 5 meters below the reference elevation topography at the right end 1116 of FIG. 11.

Bearing the examples in FIGS. 10 and 11 in mind, it may be understood that by displaying the reference topography 1010, 1110 and/or elevation map 1020, 1120 in a non-plan view, in which different altitudes are depicted in different colours, a person may gain a great appreciation for the changes in elevation in the reference topography 1010, 1110 and/or elevation map 1020, 1120. Firstly, the non-plan view projection provides a qualitative depiction of height changes in a displayed surface. Secondly, the different colours provided by the colour scale add detail to this qualitative depiction of the height changes. Further, if the colours are viewed with reference to the colour legend, the changes in colours in the surface also provide a quantitative depiction of changes altitude, either within a surface or between two or more compared surfaces. The fine detail in elevation information illustrated by having the combination of a non-plan view and a scale of colours, as described herein, can be of assistance to personnel who are using the using the illustration to evaluate current, future or past work tasks associated with the illustrated area in the mine.

In some embodiments, as illustrated in FIGS. 7-10, the range of elevation values coloured in accordance with the colour scale may span a minority of the total range of altitudes defined in the colour scale. The monitored work tasks for which this visualisation is used in the mining industry may pertain to assessment of elevations involving relatively small changes in altitude, such as defined by a road gradient. However, the absolute value of the elevation may be anywhere in a range of altitudes that is potentially orders of magnitude larger than these small changes in the road gradient. Thus the range of altitudes to be illustrated in an image may span a minority of the range covered by the colour scale. For example in some cases the illustrated range of altitudes will be within one cycle, or in some cases 2 cycles, of lightening and darkening of colours within a colour scale that includes between 6 and 8 cycles, or 7 cycles in the case of colour scale 500, over a change in 1400 or so meters. Comparing FIGS. 8 and 10, both images 800, 1000 are capable of illustrating the road gradient by changing the colour. However, the colours vary between these images because the absolute altitudes of the topography corresponding to these images is different. If the same colour scale 500, 600 is configured to be the same for both images, the difference in colour enables immediate recognition that these two images correspond to different areas of interest, spanning different altitudes, within the same mine or even from different mines altogether. From the differences in the colours in the respective images, the relative altitude positions of the corresponding areas of interest can be recognised. Further work is being simultaneously being managed for multiple areas of interest spanning different altitudes, the differences in colour between the displayed images avoids confusion over which area of interest is being viewed. The area of interest may be instantly recognised by the colour of the displayed image. Further, since the client terminal 220 only needs to generate images for an area of interest within a mine, as defined by the selected dataset, rendering of the image can be achieved in an efficient manner.

It will be understood that the invention disclosed and defined in this specification extends to all alternative combinations of two or more of the individual features mentioned or evident from the text or drawings. All of these different combinations constitute various alternative aspects of the invention.

I claim:

1. A computer implemented method of illustrating elevations in an image corresponding to an area of interest, the area of interest being at least a portion of a mine worksite, the image being generated from data that includes a plurality of elevation values defining an elevation topography for the area of interest, the image portraying the elevation topography and illustrating at least a portion of the elevation values according to a scale of colours, the scale spanning a defined range of altitudes, each colour in the scale being definable by:

a hue; and at least one parameter for influencing at least one of a lightness and a darkness of the colour, wherein the scale of colours is defined to progress through a spectrum of hues across the defined range of altitudes, wherein the at least one parameter changes to lighten and darken the colour in a cyclical manner across the defined range of altitudes, the method including the following steps:

determining, by a selection, a first dataset of said data, wherein the plurality of elevation values of the first dataset define an elevation topography for a first area of interest;

for each of the at least a portion of the elevation values in the first dataset, determining a corresponding colour for illustrating the elevation value according to the scale of colours;

generating with a computer a first image portraying at least a 3-dimensional, nonplan view of the elevation topography for the first area of interest, illustrating the at least a portion of the elevation values of the first dataset in the corresponding determined colours;

generating model data with the computer, based on the determined first dataset, defining a 3-dimensional model for illustrating on a computer display, in the first image, a 3-dimensional view of the model, portraying on the computer display divergence between an elevation map of a surface of the mine worksite for at least part of the first area of interest and the reference elevation topography by illustrating the elevation map overlayed onto the reference elevation topography; and wherein said portion of the elevation values includes reference data representing an intended elevation topography for said at least part of the first area of interest, wherein said portion of the elevation values further includes recorded data representing the elevation map of the surface of the mine worksite for said at least part of the first area of interest, the elevation map being based on measured data for the surface, and generating second model data with the computer, based on a determined second dataset, wherein a second plurality of elevation values of the second dataset respectively correspond to the plurality of elevation values of the first dataset and define an updated elevation topography for the first area of interest, defining a second 3-dimensional model for illustrating on the computer display, in a second image, at least a second 3-dimensional, non-plan view of the updated elevation topography for the first area of interest, and portraying on the computer display divergence, if any, between an updated elevation map and the reference elevation topography by illustrating the updated elevation map overlayed onto the reference elevation topography, moving earth materials at the mine worksite, by a mine operator using an earth-moving machine, by cutting away parts of the worksite that are above an intended elevation and filling areas of the worksite below an intended elevation in order to meet specification tolerances based on the portrayed divergences.

2. The method according to claim 1, wherein the determined first dataset includes elevation values correspond to:

reference data, wherein the reference data represents the reference elevation topography for the first area of interest.

3. The method according to claim 2, wherein the method includes modifying at least some of the determined colours of the elevation values corresponding to the reference elevation topography to appear semi-transparent, with the elevation map being visible through the reference elevation topography.

4. The method according to claim 3, wherein the method further includes modifying the determined colours of at least some of the elevation values to generate a rendering of the first image with respect to a notional light source and to depict a rough surface texture.

5. The method according to claim 4, wherein the method includes defining said defined range of altitudes to span between a maximum and a minimum altitude in the mine worksite.

6. A method according to claim 5, wherein the method includes the following steps:

determining, by a selection, a third dataset of said data, wherein the plurality of elevation values of the third dataset define an elevation topography for a second area of interest, wherein the first and second areas of interest correspond to different parts of the mine worksite;

for each of the at least a portion of the elevation values in the third dataset, determining a corresponding colour for illustrating the elevation value according to the scale of colours; and generating a third image portraying at least a third 3-dimensional, non-plan view of the elevation topography for the second area of interest, illustrating the at least a portion of the elevation values of the third dataset in the corresponding determined colours.

7. The method according to claim 6, wherein the elevation values in the first and third datasets span different respective ranges in altitude so that the first and third images are distinguished, by colour, according to altitude.

8. The method according to claim 7, wherein the changing of the at least one parameter includes repeated increases and decreases of a brightness parameter in a Hue, Saturation, Brightness (HSB) colour model, and wherein the brightness parameter cyclically increases and decreases between first peaks and first troughs spaced across the range of altitudes.

9. The method accordingly to claim 8, wherein a saturation parameter in the HSB colour model cyclically increases and decreases between second peaks and second troughs spaced across the range of altitudes.

10. The method accordingly to claim 9, wherein for at least a portion of the defined range of altitudes that includes a plurality of said first peaks, the brightness parameter increases and decreases according to a cycle lasting a first period, and the saturation parameter increases and decreases according to a second cycle lasting period that is half the first period.

11. The method according to claim 10, wherein the scale of colours is defined to progress through all hues defined in a HSB colour model.

12. The method according to claim 11, wherein the scale of colours includes a plurality of peaks in colour lightness, and wherein the peaks in colour lightness correspond to colours that are visually distinguishable from one another.

13. The method according to claim 12, wherein the first image includes a legend showing the scale of colours mapped to defined range of altitudes.

14. A computing system for illustrating elevations in an image corresponding to an area of interest, the area of interest being at least a portion of a mine worksite, the image being generated from data that includes a plurality of elevation values defining an elevation topography for the area of interest, the image portraying the elevation topography and illustrating at least a portion of the elevation values according to a scale of colours, the scale spanning a defined range of altitudes, each colour in the scale being definable by:

a hue; and at least one parameter for influencing at least one of a lightness and a darkness of the colour, wherein the scale of colours is defined to progress through a spectrum of hues across the defined range of altitudes, wherein the at least one parameter changes to lighten and darken the colour in a cyclical manner across the defined range of altitudes, wherein the computing system comprises:

a display device;

a memory system for storing computer executable instructions;

a processing system configured to read the computer executable instructions from the memory system, wherein upon executing the computer executable instructions, the processing system is configured to perform the following steps:

determine, by a selection, a first dataset of said data, wherein the plurality of elevation values of the first dataset define an elevation topography for a first area of interest;

for each of the at least a portion of the elevation values in the first dataset, determine a corresponding colour for illustrating the elevation value according to the colour scale;

generate, on the display device, a first image portraying at least a 3-dimensional, non-plan view of the elevation topography for the first area of interest, illustrating the at least a portion of the elevation values of the first dataset in the corresponding determined colours, and generate model data, based on the determined first dataset, that defines a 3-dimensional model for illustrating on the display device, in the first image, a 3-dimensional view of the model, portraying divergence between the elevation map and the reference elevation topography by illustrating the elevation map overlayed onto the reference elevation topography, wherein after the model data is generated and the divergence between the elevation map and the reference elevation topography is portrayed, and move by a mine operator using an earth-moving machine earth materials at the mine worksite, based on the portrayed divergence between the elevation map and the reference elevation topography by cutting away parts of the worksite that are above an intended elevation and filling areas of the worksite below an intended elevation in order to meet specification tolerances.

15. The computing system according to claim 14, wherein upon executing the computer executable instructions, the processing system is further configured to perform the following steps, after said generating the first image:

determining, by a selection, a second dataset of said data, wherein the plurality of elevation values of the second dataset define an elevation topography for a second area of interest, wherein the first and second areas of interest correspond to different parts of the mine worksite;

for each of the at least a portion of the elevation values in the second dataset, determining a corresponding colour for illustrating the elevation value according to the colour scale; and generating a second image portraying at least a 3-dimensional, non-plan view of the elevation topography for the second area of interest, illustrating the at least a portion of the elevation values of the second dataset in the corresponding determined colours.

16. The computing system according to claim 15, wherein the memory system includes a database that stores the first and second datasets in different files, and wherein the processing system includes:

a user terminal, wherein the user terminal is configured to enable a user to control said selection that determines the first dataset and said selection that determines the second dataset; and an application server configured to receive the selection and, according to the selection, to send the determined one of the first and second datasets to the user terminal to generate the image.

17. The computing system according to claim 16, wherein the determined first dataset includes elevation values corresponding to:

recorded data, wherein the recorded data represents an elevation map of a surface of the mine worksite for the first area of interest, the elevation map being based on measured data for the surface; and reference data, wherein the reference data represents a reference elevation topography for the first area of interest.

18. A computer implemented method of illustrating elevations in an image corresponding to an area of interest, the area of interest being at least a portion of a mine worksite, the image being generated from a dataset that includes a plurality of elevation values defining an elevation topography for the area of interest, the image portraying the elevation topography and illustrating at least a portion of the elevation values according to a scale of colours, the scale spanning a defined range of altitudes, each colour in the scale being definable by:

a hue; and at least one parameter for influencing at least one of a lightness and a darkness of the colour, wherein the scale of colours is defined to progress through a spectrum of hues across the defined range of altitudes, wherein the at least one parameter changes to lighten and darken the colour in a cyclical manner across the defined range of altitudes, the method including the following steps:

determining the dataset;

for each of the at least a portion of the elevation values in the dataset, determining a corresponding colour for illustrating the elevation value according to the scale of colours; and generating with a computer an image portraying at least a 3-dimensional, non-plan view of the elevation topography for the area of interest, illustrating the at least a portion of the elevation values of the dataset in the corresponding determined colours;

wherein the determined dataset includes elevation values corresponding to:

recorded data, wherein the recorded data represents an elevation map of a surface of the mine worksite for the area of interest, the elevation map being based on measured data for the surface; and reference data, wherein the reference data represents a reference elevation topography for the area of interest; and the method includes generating model data, based on the determined dataset, defining a 3-dimensional model for illustrating on a computer display, in the image, a 3-dimensional view of the model, portraying divergence between the elevation map and the reference elevation topography by illustrating the elevation map overlayed onto the reference elevation topography, wherein the elevation map and reference elevation topography are displayed with different respective surface textures, wherein after the model data is generated and the divergence between the elevation map and the reference elevation topography is portrayed, and move by a mine operator using an earth-moving machine earth materials at the mine worksite, based on the portrayed divergence between the elevation map and the reference elevation topography by cutting away parts of the worksite that are above an intended elevation and filling areas of the worksite below an intended elevation in order to meet specification tolerances.

* * * * *